(12) United States Patent
Knoerr

(10) Patent No.: US 10,840,417 B2
(45) Date of Patent: Nov. 17, 2020

(54) METHOD FOR MANUFACTURING AN OPTOELECTRONIC COMPONENT AND OPTOELECTRONIC COMPONENT

(71) Applicant: OSRAM Opto Semiconductors GmbH, Regensburg (DE)

(72) Inventor: Matthias Knoerr, Tanjung Tokong (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 16/302,614

(22) PCT Filed: May 16, 2017

(86) PCT No.: PCT/EP2017/061713
§ 371 (c)(1),
(2) Date: Nov. 16, 2018

(87) PCT Pub. No.: WO2017/198656
PCT Pub. Date: Nov. 23, 2017

(65) Prior Publication Data
US 2019/0296201 A1  Sep. 26, 2019

(30) Foreign Application Priority Data
May 18, 2016 (DE) .................. 10 2016 208 489

(51) Int. Cl.
*H01L 33/54* (2010.01)
*H01L 33/52* (2010.01)
*H01L 33/50* (2010.01)
*H01L 33/58* (2010.01)
(Continued)

(52) U.S. Cl.
CPC .......... *H01L 33/54* (2013.01); *H01L 25/0753* (2013.01); *H01L 33/486* (2013.01); *H01L 33/508* (2013.01); *H01L 2933/005* (2013.01)

(58) Field of Classification Search
CPC ...................................................... H01L 33/54
See application file for complete search history.

(56) References Cited

U.S. PATENT DOCUMENTS 7,785,941 B2 * 8/2010 Liu .................. H01L 21/28525
257/E21.04
2013/0001605 A1  1/2013 Ishihara et al.
(Continued)

FOREIGN PATENT DOCUMENTS

DE  102010033963 A1  2/2012
DE  102014101154 A1  7/2015
(Continued)

*Primary Examiner* — Moazzam Hossain
(74) *Attorney, Agent, or Firm* — Slater Matsil, LLP

(57) ABSTRACT

A method for manufacturing an optoelectronic component and an optoelectronic component are disclosed. In an embodiment, a method includes applying a conversion layer including a luminescence conversion material to a support plate including a glass, arranging at least two optoelectronic semiconductor chips over the conversion layer on a side remote from the support plate and forming an envelope material free from a luminescence conversion material between the optoelectronic semiconductor chips, thereby forming a workpiece.

9 Claims, 16 Drawing Sheets

(51) Int. Cl.
*H01L 25/075* (2006.01)
*H01L 33/48* (2010.01)

(56) References Cited

U.S. PATENT DOCUMENTS

| | | | |
|---|---|---|---|
| 2013/0004699 A1* | 1/2013 | Zhou | C09K 11/02 |
| | | | 428/76 |
| 2013/0193470 A1 | 8/2013 | Weidner et al. | |
| 2014/0043810 A1* | 2/2014 | Jo | F21V 29/83 |
| | | | 362/235 |
| 2015/0188000 A1 | 7/2015 | Huang et al. | |
| 2015/0333236 A1 | 11/2015 | Yoneda et al. | |
| 2015/0364663 A1 | 12/2015 | Morimura et al. | |
| 2016/0071830 A1* | 3/2016 | Lin | H01L 25/167 |
| | | | 257/88 |

FOREIGN PATENT DOCUMENTS

| | | |
|---|---|---|
| EP | 2620989 A2 | 7/2013 |
| JP | 2008034188 A | 2/2008 |
| JP | 2012138454 A | 7/2012 |
| JP | 2013016566 A | 1/2013 |
| JP | 2013016588 A | 1/2013 |
| JP | 2014027208 A | 2/2014 |
| JP | 2014120571 A | 6/2014 |
| JP | 2015126209 A | 7/2015 |
| JP | 2015201665 A | 11/2015 |
| JP | 2016001697 A | 1/2016 |
| WO | 2013088309 A1 | 6/2013 |

* cited by examiner

METHOD FOR MANUFACTURING AN OPTOELECTRONIC COMPONENT AND OPTOELECTRONIC COMPONENT

This patent application is a national phase filing under section 371 of PCT/EP2017/061713, filed May 16, 2017, which claims the priority of German patent application 10 2016 208 489.5, filed May 18, 2016, each of which is incorporated herein by reference in its entirety.

TECHNICAL FIELD

A method for manufacturing an optoelectronic component is provided. Furthermore, an optoelectronic component producible by this method, for example, is provided.

BACKGROUND

U.S. Publication No. 2015/0188000 A1 describes a method for manufacturing an optoelectronic component as well as an optoelectronic component.

SUMMARY OF THE INVENTION

Embodiments provide a method for manufacturing an optoelectronic component configured to be performed in a particularly cost-effective manner. Further embodiments provide an optoelectronic component by which, for example, white light may be generated in a particularly homogenous manner. Yet other embodiments provide an optoelectronic component producible in a particularly cost-effective manner. Additional embodiments provide an optoelectronic component which is built in a particularly compact manner.

A method for manufacturing an optoelectronic component is provided. For example, the optoelectronic component may be a light-emitting diode. Furthermore, it is also possible that the optoelectronic component is a laser diode.

According to at least one embodiment, the method for manufacturing an optoelectronic component comprises a method step in which a support plate including a glass is provided. Here, the support plate may consist of a glass or include a glass. If the support plate includes further materials besides the glass, the glass may constitute, for example, a matrix material into which the further materials are introduced. Also in this case, the support plate may predominantly be formed of glass, that is to say, the glass weight proportion of the support plate then amounts to, for example, at least 50%, particularly at least 70%.

The support plate is, for example, a disc the extension of which in two orthogonal directions in space is large compared to its extension towards a third orthogonal direction in space. For example, the support plate has a surface area of 10 cm$^2$ or more as well as a thickness of 200 μM or less. The support plate may have edge lengths of at least 10 cm to at most 50 cm such that the surface area of the support plate may amount inter alia up to 2500 cm$^2$. The thickness of the support plate then ranges between at least 25 μm and at most 200 μm. A support plate comprising a glass may especially be characterized by its particularly uniform thickness, wherein the variation of the thickness across the entire support plate may be equal to 5 μm or less.

According to at least one embodiment, the method comprises a step in which a conversion layer comprising a luminescence conversion material is applied to the support plate. Here, the conversion layer contains at least one luminescence conversion material or consists of the at least one luminescence conversion material. The luminescence conversion material of the conversion layer is, for example, an inorganic or organic luminescent material, which, upon excitation with electromagnetic radiation, emits electromagnetic radiation with a longer wavelength. For instance, upon excitation with blue light the luminescence conversion material emits yellow or green-yellow light so that white or green-white light may be emitted by the finished component in operation.

In addition to a luminescence conversion material, the conversion layer may include further materials, for example, a matrix material, into which the luminescence conversion material is introduced. A matrix material may, for example, be silicone, an epoxy resin or a hybrid material of silicone and epoxy resin. The conversion layer has, for example, a thickness of at least 10 μm and at most 100 μm.

The conversion layer may be applied to the support plate, for example, to the upper surface of the support plate, in a large-area scale or may be partitioned into a number of portions. After applying the conversion layer, for example, the conversion layer covers at least 50%, particularly at least 70%, of the surface of the support plate the conversion layer is applied to. The conversion layer is a laminar layer in which lateral extensions in a plane parallel to a main extension plane of the support plate are large compared to the thickness of the conversion layer in a direction perpendicular the main extension plane of the support plate. Furthermore, the conversion layer is particularly characterized by an especially uniform thickness, wherein the variation of the thickness of the conversion layer across the entire conversion layer may, for example, be less than 10%, in particular less than 5%.

According to at least one embodiment of the method, at least two optoelectronic semiconductor chips are applied to the conversion layer at its side opposite to the support plate. The optoelectronic semiconductor chips are, for example, light-emitting diodes that generate light, in particular colored light or UV radiation, during operation. The light-emitting diode chips are put on the conversion layer such that a radiation transmission surface of the light-emitting diode chips respectively adjoins the conversion layer, respectively. Furthermore, it is possible that at least some of the optoelectronic semiconductor chips are detector chips, such as photodiodes.

In particular, it is possible that, in the method step of applying the optoelectronic semiconductor chips, a plurality of optoelectronic semiconductor chips is applied to the conversion layer, wherein the optoelectronic semiconductor chips may be arranged at the node points of a regular grid, e.g., a square grid, for example, within the manufacturing tolerance.

According to at least one embodiment of the method for manufacturing an optoelectronic component, the method comprises a step in which an envelope material free from a luminescence conversion material is introduced between the optoelectronic semiconductor chips. The envelope material is, for example, a material comprising a silicone, an epoxy resin or a hybrid material of silicone and epoxy resin as a matrix material or consisting of at least one of the mentioned materials. Here, the envelope material is free from the luminescence conversion material being present in the conversion layer or from the luminescence conversion materials present in the conversion layer. In particular, it is possible that the envelope material is free from any luminescence conversion material during the application of the envelope material. Nevertheless, the envelope material may be filled with pigments, dyes and/or diffusor materials. In this way, it is possible that the envelope material appears black, colored or reflecting white. After applying the envelope material, it is possible that the luminescence conversion material diffuses out of the conversion layer at the interface between the conversion layer and the envelope material into the envelope material in a small extent. At least while applying the envelope material, however, no luminescence conversion material is present in it, and luminescence conversion material is deliberately not introduced into the envelope material.

According to at least one embodiment of the method for manufacturing an optoelectronic component, the method comprises the following steps: providing a support plate including a glass, applying a conversion layer including a luminescence conversion material to the support plate, applying at least two optoelectronic semiconductor chips to the conversion layer at its side opposite to the support plate, and introducing an envelope material free from a luminescence conversion material between the optoelectronic semiconductor chips.

The mentioned method steps may particularly be executed in the stated sequence.

In particular, it is possible that each of the optoelectronic components comprises two or more optoelectronic semiconductor chips after being separated into a number of optoelectronic components. The optoelectronic semiconductor chips may, for example, be light-emitting semiconductor chips emitting light of the same color or light of a color different from each other in operation.

As a result, by means of this method it is possible to manufacture optoelectronic components comprises more than one optoelectronic semiconductor chip wherein the optoelectronic semiconductor chips may be arranged particularly close to each other. The optoelectronic components manufactured by the method are therefore particularly compact.

If optoelectronic semiconductor chips are put side by side on a circuit board, as is, for example, the case when manufacturing conventional optoelectronic components or optoelectronic modules, the minimum distance between two adjacent optoelectronic semiconductor chips normally amounts to 500 µm or more due to manufacturing reasons. In the method described here, however, it is possible to produce optoelectronic components in which a minimum distance of 50 µm or less between adjacent optoelectronic semiconductor chips is achievable.

This is due to the fact that in the method described herein optoelectronic semiconductor chips are, for example, not put on predetermined electric contact pads which are connected with the semiconductor chips by soldering. Rather, the semiconductor chips are put on a patterned or non-patterned conversion layer. As a result an alignment of electric contact pads of the optoelectronic semiconductor chips with contact points of a circuit board is not necessary. For example, in a component manufactured by the described method the distance between two adjacent optoelectronic semiconductor chips is at least 20 µm and at most 50 µm.

The method described here is particularly based on the following ideas and findings:

In the method a support plate of glass which may remain in the completed optoelectronic component is used as a support for the conversion layer, the optoelectronic semiconductor chips as well as the envelope material. During the manufacturing method the support plate serves as a mechanical support on which the described method steps are performed. Due to the fact that the support plate takes the role of a support for the remaining components of the component during the production of the optoelectronic component, a more simple processing and thus a more cost-effective manufacturing method is enabled.

After manufacturing the optoelectronic component, a part of the support plate remaining in the component may serve as a cover plate protecting the other portions of the optoelectronic component against mechanical and chemical influences. In this way, inter alia it is possible to use sensitive materials, for example, sensitive luminescence conversion materials, such as organic luminescent materials or quantum dot converters, in the produced optoelectronic component. Furthermore, due to the support plate remaining in the component, the component is mechanically particularly stable, and the risk of cracking is lower than in conventional components.

Furthermore, the described method is characterized in that the luminescence conversion material is present only in a conversion layer configured to be formed relatively thin and not in the envelope material. Thus, on the one hand, the method is cost-saving because substantially less material of the often expensive luminescence conversion material has to be used compared with the case in which also the envelope material is filled with the luminescence conversion material. On the other hand, a conversion layer—contrary to a casting body or a mold material—may be formed with a very uniform thickness. As a consequence the optical path of electromagnetic radiation generated by the component in the semiconductor chip in operation through the conversion layer is relatively uniform regardless of the entry point into the conversion layer. In this manner, the optoelectronic component manufactured by the method may generate, for example, white mixed light with high homogeneity over a wide viewing angle range.

According to at least one embodiment of the method, lateral surfaces of the optoelectronic semiconductor chips substantially remain uncovered by the conversion layer. The lateral surfaces of the optoelectronic semiconductor chips are those surfaces which connect radiation transmission surfaces, facing the support plate, of the semiconductor chips and bottom surfaces, remote from the support plate, of the optoelectronic semiconductor chips with each other. In applying the optoelectronic semiconductor chips to the conversion layer, the optoelectronic semiconductor chips are not impressed into the conversion layer with force such that the conversion layer extends along the lateral surfaces of the optoelectronic semiconductor chips, but according to this embodiment of the method the optoelectronic semiconductor chips are only placed on the conversion layer. Thus, it can be ensured that the lateral surfaces of the optoelectronic semiconductor chips remain free from luminescence conversion material within the manufacturing tolerance till completing the optoelectronic component, since in placing the semiconductor chips no, or little, luminescence conversion material gets to the lateral surfaces.

According to at least one embodiment of the method, the conversion layer has a substantially constant thickness after the application of at least two optoelectronic semiconductor chips. That is to say, the conversion layer is not compressed, and thereby not reduced in its thickness, in a portion in which an optoelectronic semiconductor chip is placed on the conversion layer, but the uniform thickness of the conversion layer prior to the application of the semiconductor chips remains unchanged also after the application of the optoelectronic semiconductor chips.

According to at least one embodiment of the method, the conversion layer imparts an adhesion between the at least two optoelectronic semiconductor chips on the one hand and the support plate on the other hand. This means that it is possible that the optoelectronic semiconductor chips, for example, at their radiation transmission surfaces facing the support plate, are attached, for instance sticked, to the support plate by means of the conversion layer. In this case the conversion layer, in addition to its optical characteristics, serves a mechanical adhesion layer between the optoelectronic semiconductor chips and the support plate. For instance, this can be achieved in that a hardening of the conversion layer is performed not prior to the application of the at least two optoelectronic semiconductor chips, but only after all optoelectronic semiconductor chips have been applied.

In this embodiment of the method, it is particularly possible that the conversion layer is directly adjacent to the support plate and to the optoelectronic semiconductor chips such that prior to applying the envelope material a mechanical connection between these portions is accomplished exclusively by the conversion layer.

According to at least one embodiment of the method, the conversion layer has at least two portions that are spaced apart from each other. This means that the conversion layer is not applied to the total surface in an unpatterned manner, but the conversion layer is applied to the support plate in a patterned manner, partitioned into portions spaced apart from each other. Thus, it is particularly possible that the number of portions of the conversion layer corresponds to the number of optoelectronic semiconductor chips which are to be applied to the conversion layer in the subsequent method step.

According to at least one embodiment of the method, exactly one of the at least two optoelectronic semiconductor chips is applied to each of the at least two portions of the conversion layer while applying the at least two optoelectronic semiconductor chips. This means, that there is a one-to-one correlation between the portions of the conversion layer and the optoelectronic semiconductor chips such that exactly one optoelectronic semiconductor chip applied to the conversion layer in the portion is associated to each portion, and vice versa.

According to at least one embodiment of the method, each of the at least two optoelectronic semiconductor chips completely or substantially completely overlaps or covers the portion of the conversion layer it is applied to. That means that the portion of the conversion layer does not, or only negligibly, extend beyond the lateral surfaces of the associated optoelectronic semiconductor chip in lateral directions. Particularly, in this case it is also possible that on the one hand the semiconductor chip does not, or hardly, protrude from the associated portion in lateral directions. This means that it is particularly possible that the portion of the conversion layer in a plane parallel to the main extension plane of the support plate has a form as well as a size corresponding to the form and size of the surface of the optoelectronic semiconductor chip, for example, the radiation transmission surface, facing the conversion layer, within the manufacturing tolerance.

According to at least one embodiment of the method, the conversion layer has at least two portions spaced from each other. In applying the at least two optoelectronic semiconductor chips to each of the at least two portions of the conversion layer exactly one of the at least two optoelectronic semiconductor chips is applied to each of the portions, and each of the at least two optoelectronic semiconductor chips completely or substantially completely covers the portion of the conversion layer it is applied to.

Herein, substantially completely may particularly mean that at most 10% of the surface of the portion of the conversion layer, particularly at most 5% of the surface of the portion of the conversion layer, remain uncovered by the associated semiconductor chip.

In this embodiment it is particularly possible that the material of the conversion layer is applied to the support plate only at portions where an optoelectronic semiconductor chip is to be placed later. Thus, luminescence conversion material may be further saved than this is already the case. In this way, furthermore it is possible to protect the conversion layer against environmental influences more effectively than this is already the case due to the support plate, because also lateral surfaces of the conversion layer may be covered with the protecting material.

According to at least one embodiment of the method, the envelope material covers lateral surfaces of each of the at least two portions of the conversion layer after introducing the envelope material. By applying the conversion layer in a patterned manner in portions spaced apart from each other it is possible to apply the envelope material such that it also covers the lateral surfaces of the associated portion of the conversion layer in addition to the lateral surfaces of the semiconductor chips. The lateral surfaces of the portion of the conversion layer are those surfaces which connect the surface facing the associated semiconductor chip and the surface remote from the associated semiconductor chip with each other. In this way, according to this embodiment the lateral surfaces of the portions of the conversion layer are preferably completely covered by the envelope material. The conversion layer is then completely surrounded by additional portions of the optoelectronic component. Thus, for example, the conversion layer at the first main surface thereof adjoins the support plate formed of a glass and adjoins the associated optoelectronic semiconductor chip at the second main surface thereof. The lateral surfaces adjoin the envelope material. In this way, the conversion layer is also completely encapsulated and therefore especially effectively protected against external mechanical or chemical influences such that particularly sensitive luminescence conversion materials may be used in the conversion layer.

According to at least one embodiment of the method, different ones of the at least two portions of the conversion layer have thicknesses different from each other. This means that in the embodiment of the method in which the conversion layer is applied in form of portions spaced from each other, it is possible that the conversion layer does not have a uniform thickness, but that a different thickness is deliberately selected in different portions of the conversion layer. Within the portions of the conversion layer the thickness then remains constant within the manufacturing tolerance. In this way, it is possible that combinations of portions of the conversion layer and optoelectronic semiconductor chips generating, for example, light of color different from each other or color coordinates different from each other may be created on one and the same support plate.

In addition, it is possible that due to the different portions production variations in color coordinates of the light generated by the optoelectronic semiconductor chips are adjusted or balanced such that the completed optoelectronic components emit light in a narrower color coordinate range than it would be possible without adjusting the thickness of the conversion layer. Moreover, it is possible that instead of, or additionally to, the thickness of the conversion layer the material composition of the conversion layer is also varied in the portions. Thus, the kind or density of the luminescence conversion material in the conversion layer may deliberately be different from each other in different portions of the conversion layer. In this way, for example, it is also possible that in a portion the conversion layer has only luminescence conversion material emitting red light in operation of the finished component and has only luminescence conversion material emitting green light in operation in another portion. Furthermore, it is possible that the different material composition of the conversion layer in the different portions deliberately leads to different color coordinates of the mixed light emitted by the completed component. Thus, for example, warm white light may be emitted in a portion, whereas cool white light is emitted in another portion.

According to at least one embodiment of the method, a separation into a number of optoelectronic components is performed, wherein each of the optoelectronic components includes at least one of the at least two optoelectronic semiconductor chips, a part of the support plate, a part of the conversion layer as well as a part of the envelope material. The part of the support plate remaining in the optoelectronic component forms a cover plate in the completed optoelectronic component closing the optoelectronic component at the light-emitting surface to the outside. The part of the envelope material remaining in the optoelectronic semiconductor component forms a housing body enclosing the optoelectronic semiconductor chip at its lateral surfaces. Then, this housing body can directly adjoin the optoelectronic semiconductor chip at the lateral surfaces of the semiconductor chip. The optoelectronic component may here comprise one, two or more optoelectronic semiconductor chips, depending on along which separation lines a dicing is carried out.

Furthermore, an optoelectronic component is provided. The optoelectronic component described here may in particular be manufactured by a method, described here, for manufacturing an optoelectronic component. That means that all features disclosed for the method are also disclosed for the optoelectronic component, and vice versa.

According to at least one embodiment, an optoelectronic component is provided comprising: an optoelectronic semiconductor chip, a conversion layer arranged at an upper surface of the semiconductor chip, and a cover plate comprising a glass at a side of the conversion layer, remote from the semiconductor chip, wherein the conversion layer comprises a luminescence conversion material, the conversion layer is arranged between the optoelectronic semiconductor chip and the cover plate, and lateral surfaces of the optoelectronic semiconductor chip are substantially free from the conversion layer.

The cover plate of the optoelectronic component may particularly be the part of the support plate remaining within the optoelectronic component after the completion of the method described here.

In the optoelectronic component described here, the lateral surfaces of the optoelectronic semiconductor chip are substantially free from the conversion layer. "Substantially free from the conversion layer" means here that, within the manufacturing tolerance, the conversion layer does not extend to the lateral surfaces of the optoelectronic semiconductor chip, but is exclusively arranged on the main surface facing the cover plate, in particular the radiation transmission surface, of the optoelectronic semiconductor chip. Here, the lateral surfaces are covered by material of the conversion layer, for example, by at most 5%, in particular at most 1%.

In the optoelectronic component described here, in particular the insight is exploited that due to the conversion layer which has a thickness in the component uniform within the manufacturing tolerance, mixed light of the electromagnetic radiation primarily generated in the semiconductor chip and of the electromagnetic radiation secondarily emitted by the luminescence conversion material in the conversion layer may be generated which is characterized by a particularly homogeneous color coordinate distribution over a wide range of viewing angles.

In the optoelectronic component described here, additionally it is particularly possible that the conversion layer directly adjoins the cover plate and the optoelectronic semiconductor chip. In this case the conversion layer, in addition to its optical characteristics, may also fulfill the function of an adhesion layer imparting a mechanical connection between the optoelectronic semiconductor chip and the cover plate.

According to at least one embodiment of the optoelectronic component, the optoelectronic semiconductor component comprises a housing body covering the lateral surfaces of the optoelectronic semiconductor chip and formed in a reflective manner. The housing body is the hardened envelope material, provided that the optoelectronic component is manufactured by a method described here. Thus, the housing body may directly adjoin the optoelectronic semiconductor chip, the conversion layer and, where appropriate, the cover plate.

For example, the housing body may be formed in a light reflecting manner, for example, the housing body has a reflectivity of at least 50%, in particular of at least 75%, for the electromagnetic radiation generated in the optoelectronic semiconductor chip as well as in the conversion layer in operation. In doing so, the housing body may be formed colored or particularly white. For this purpose, the housing body may include a matrix material such as, for example, silicone or epoxy resin into which particles of a light diffusing or light reflecting material such as titanium dioxide are introduced. In addition, the housing body may include further materials; however it is preferably free from the luminescence conversion material of the conversion layer or the luminescence conversion materials of the conversion layer or devoid of any luminescence conversion material.

According to at least one embodiment of the optoelectronic component, the housing body covers lateral surfaces of the conversion layer. In this case, the conversion layer in the optoelectronic component is, for example, formed such that it is formed substantially congruently or congruently with the main surface, facing it, of the optoelectronic semiconductor chip. That means that then, for example, in a main extension plane of the cover plate the conversion layer has a surface area deviating from the surface, facing the conversion layer, of the semiconductor chip in size and form by at most 10%, in particular by at most 5%. In this embodiment the housing body is particularly in direct contact with the cover plate which then protrudes from the conversion layer and the optoelectronic semiconductor chip in lateral directions. Thus, also the conversion layer is within the housing body of the optoelectronic component and, therefore, is protected against external mechanical or chemical influences especially well.

According to at least one embodiment of the optoelectronic component, the housing body is in direct contact with the optoelectronic semiconductor chip, the conversion layer and cover plate. In particular, in this embodiment it is possible that the optoelectronic semiconductor component consists of the housing body, the optoelectronic semiconductor chip as well as the conversion layer and the cover plate and does otherwise include no further components.

According to at least one embodiment of the optoelectronic component, the conversion layer in the component has a substantially constant thickness. For example, this may mean that the conversion layer has a constant thickness within the manufacturing tolerance. For instance, this means that the thickness of the conversion layer varies at most by 10%, particularly at most by 5%, across the entire conversion layer.

According to at least one embodiment of the optoelectronic component, the cover plate includes a glass into which particles of at least one of the following materials are introduced: the luminescence conversion material, an additional luminescence conversion material, diffusor material. This means that, for example, the luminescence conversion material existing also in the conversion layer is introduced into the cover plate. Alternatively or additionally, it is possible that another luminescence conversion material which generates light of a different color than the luminescence conversion material in the conversion layer upon excitation, for example, is introduced into the cover plate. Finally, the cover plate may additionally or alternatively contain a diffusor material. The diffusor material is, for example, configured to diffuse and/or reflect incident electromagnetic radiation. In this manner an exit probability out of the cover plate may be increased, particularly increasing the brightness of the light generated by the optoelectronic component in operation. Alternatively or additionally, it is possible that the outer surface, opposite to the semiconductor chip, of the cover plate is roughened.

In case that the component includes two or more semiconductor chips, it is possible that at least one of the optoelectronic semiconductor chips is a detector chip, such as, for example, a photodiode. In this way, the component may, for example, be a light-emitting diode with an integrated ambient light sensor.

According to at least one embodiment of the optoelectronic component, the optoelectronic component includes at least two optoelectronic semiconductor chips arranged laterally spaced from each other, wherein all optoelectronic semiconductor chips are covered by the cover plate. The distance between adjacent optoelectronic semiconductor chips, at least in a lateral direction, may here be, for example, at least 20 µm and at most 50 µm. Such small distances between the optoelectronic semiconductor chips are particularly enabled by the manufacturing according to the method described herein.

A material of the housing body is arranged between the optoelectronic semiconductor chips of the optoelectronic semiconductor component. Particularly, if the housing body is formed in a way impermeable to radiation, for example, reflective, in this way the housing body prevents an optical crosstalk between the optoelectronic semiconductor chips of the component. In case that the optoelectronic semiconductor chips of the component are light-emitting semiconductor chips, for example, thus these may also be driven independently of each other without any cross luminescence of adjacent optoelectronic semiconductor chips.

Thereby, the cover plate of the component covers all optoelectronic semiconductor chips of the component. The cover plate and the housing body thus are the components of the optoelectronic component which mechanically support the optoelectronic semiconductor chips and hold them together.

Furthermore, it is thereby possible that also the conversion layer covers all optoelectronic semiconductor chips. In this case the conversion layer is arranged, for example, in an unstructured manner, as a simply connected continuous layer between the optoelectronic semiconductor chips and the cover plate. Particularly due to the fact that in the present optoelectronic component the optoelectronic semiconductor chips may be arranged especially close to each other, by means of such a continuous conversion layer covering all optoelectronic semiconductor chips it is possible to provide a light-emitting optoelectronic component having a highly homogeneous luminous surface. This means that, for example, luminance variations measured at the outer surface, opposite to the optoelectronic semiconductor chips, of the cover plate are small and, for example, not present within the manufacturing tolerance.

According to at least one embodiment of the optoelectronic component, the conversion layer is partitioned into a number of portions, exactly one portion of the conversion layer is associated to each optoelectronic semiconductor chip in a one-to-one relationship, wherein the portions are arranged laterally spaced from each other and the housing body is arranged in places between the portions. In other words, in this embodiment of the optoelectronic component each of the optoelectronic semiconductor chips adjoins a portion of the conversion layer no other optoelectronic semiconductor chip adjoins. Material of the housing body may be arranged between the portions of the conversion layer, particularly preventing an optical crosstalk between adjacent portions of the conversion layer, particularly in case that the housing body is formed reflectively. The distance between two adjacent portions of the conversion layer here is in the range of the distance between two adjacent optoelectronic semiconductor chips and may, for example, be at least 15 µm and at most 50 µm.

In doing so, it is particularly possible that portions of the conversion layer associated to different optoelectronic semiconductor chips are different to each other in terms of their thickness and/or their material composition. Thus, for example, it is possible to use optoelectronic semiconductor chips associated to different bins in one and the same optoelectronic component. A difference in the color coordinates of the mixed light emitted by the optoelectronic semiconductor chip and the associated portion of the conversion layer may then, for example, be compensated by a change of the material composition of the portion of the conversion layer or by a change of the thickness of the portion of the conversion layer. In this way, in manufacturing the component less waste of unusable semiconductor chips occurs leading to smaller costs in the manufacture of the component. On the other hand, it is possible to deliberately generate mixed light of different color or different color coordinate by the different portions of the conversion layer. Thus, warm white and cold white light may, for example, be generated by one and the same component.

According to at least one embodiment of the optoelectronic component, the optoelectronic component includes an electric connecting element at a lower surface, opposite to the cover plate, of the optoelectronic component, wherein the electric connecting element electrically connects at least two of the optoelectronic semiconductor chips with each other. The electric connecting element is, for example, a metallization which may be applied by methods such as evaporation deposition, sputtering, physical vapor deposition or the like. By means of the electric connecting element, for example, it is possible to connect two adjacent optoelectronic semiconductor chips electrically in series with each other. If a number of electric connecting elements, for example, two or more connecting elements, is used in the component, thus it is possible to connect the optoelectronic semiconductor chips in the component electrically in series, electrically parallel to each other or partly in series and partly parallel to each other. In this way, for example, a component may be implemented configured to be operated with a high voltage, for example, with a voltage higher than 6V, particular with a voltage of 12V or 24V.

BRIEF DESCRIPTION OF THE DRAWINGS

Below, the method described herein as well as the optoelectronic component described herein are explained in more details by means of embodiments and the related figures.

Identical, similar or equally functioning elements are designated by the same reference signs throughout the figures. The figures and the proportions of the elements between them depicted in the figures are not to be considered as being scaled. In fact, individual elements may be depicted excessively in size for a better representability and/or for a better understanding.

DETAILED DESCRIPTION OF ILLUSTRATIVE EMBODIMENTS

Figure 1A:
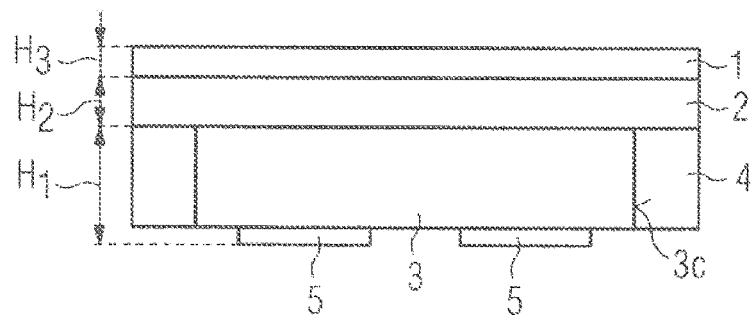
FIGS. 1A to 1C show schematic illustrations of an optoelectronic component according to a first embodiment.

By means of a schematic sectional view, FIG. 1A shows a first embodiment of an optoelectronic component described herein. The optoelectronic component includes an optoelectronic semiconductor chip 3, which is, for example, a light-emitting diode chip. The optoelectronic semiconductor chip 3 comprises two contact pads 5 by means of which the optoelectronic semiconductor chip may electrically be contacted and operated. The contact pads 5 may be located at a bottom surface of the semiconductor chip 3 such that both the semiconductor chip 3 and the optoelectronic component are configured to be surface-mounted.

Furthermore, the optoelectronic component includes a cover plate 1 which comprises a glass and which may, for example, consist of a glass.

The cover plate 1 is characterized by a thickness constant within the manufacturing tolerance.

The conversion layer 2 containing the luminescence conversion material or consisting of it is arranged between the optoelectronic semiconductor chip 3 and the cover plate 1. According to the embodiment of FIG. 1A the conversion layer 2 protrudes from the optoelectronic semiconductor chip 3 in lateral directions as can particularly also be seen in the plan view of FIG. 1B. The cover plate 1, the conversion layer 2 and the optoelectronic semiconductor chip 3 adjoin directly to each other, respectively, wherein the conversion layer 2 imparts an adhesion between the optoelectronic semiconductor chip 3 and the cover plate 1.

Additionally, the optoelectronic component includes a housing body 4 arranged at the lateral surfaces 3c of the semiconductor chip 3 and covering these completely. This is particularly illustrated in the plan view of the bottom surface of the optoelectronic component at its side opposite to the cover plate 1 in FIG. 1C.

The housing body 4 directly adjoins the optoelectronic semiconductor chip and the conversion layer 2. The housing body 4 does not contact the cover plate 1. The housing body 4 may, for example, be reflective to radiation and white. Electromagnetic radiation generated in the semiconductor chip 3 during operation and impinging on the housing body 4 is reflected into the semiconductor chip 3 or into the conversion layer 2 so as to enter the cover plate 1 after its passage through the semiconductor chip 3 or the conversion layer 2.

The conversion layer 2 in the optoelectronic component has a substantially uniform thickness and the lateral surfaces 3c of the optoelectronic semiconductor chip 3 are free from or uncovered by the conversion layer 2 such that the optoelectronic component in operation may generate mixed radiation of particularly high homogeneity.

The thickness Hi of the optoelectronic semiconductor chip 3 is, for example, 150 μm, the thickness of the conversion layer 2 is 50 μm and the thickness of the cover plate 1 is at least 25 μm.

In conjunction with the schematic sectional views of FIG. 2A to 2G, a first embodiment of a method described herein is explained in more detail.

For example, a support plate 10 is provided in a first method step of this method. The support plate 10 may be a 6 inch disc clamped into a not shown frame. The support plate here is, for example, made of glass, FIG. 2A.

Figure 2A:
FIGS. 2A to 2G show schematic illustrations of a first embodiment of a method for manufacturing an optoelectronic component.
Figure 2B:

In the next method step, FIG. 2B, a conversion layer 2 is applied in a large-area scale to the support plate 10, for example, by means of spray coating or by means of laminating with a film. The conversion layer 2 contains at least one luminescence conversion material.

Figure 2C:
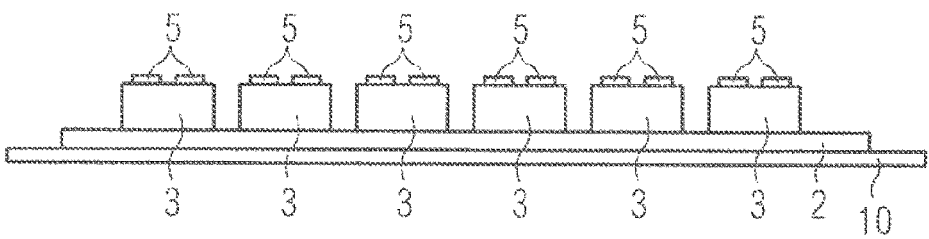

In the subsequent method step, FIG. 2C, a plurality of optoelectronic semiconductor chips is put on a side of the conversion layer 2, remote from the support plate 10. In doing so, the conversion layer 2 is configured to impart an adhesion between the support plate 10 and the optoelectronic semiconductor chips 3.

Figure 2D:
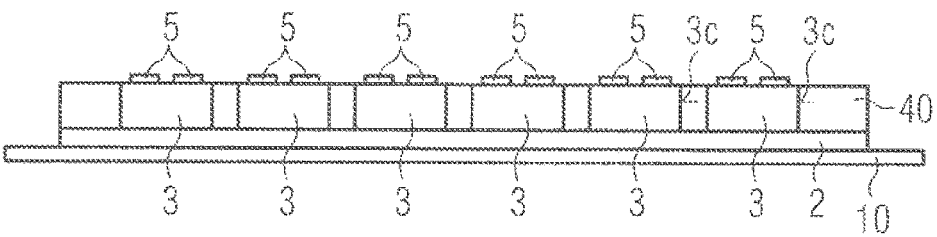

In conjunction with FIG. 2D, a subsequent method step is shown in which an envelope material 40 which may be, for example, silicone filled with titanium dioxide is applied between the optoelectronic semiconductor chips and to the conversion layer 2. The side of the semiconductor chips 3, remote from the support plate 10, may remain uncovered by the envelope material 40.

For example, the envelope material 40 is applied by casting or molding (for example, film-assisted molding).

Furthermore, a hardening or curing of the envelope material 40 may follow.

Figure 2E:
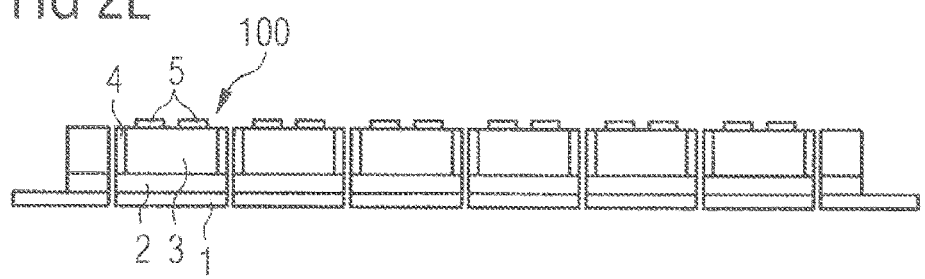

In the following method step, FIG. 2E, the arrangement is diced or separated into individual optoelectronic components 100, for instance by techniques such as plasma glazing and tapeless sawing.

In plasma glazing, for instance glazing of the outer surface of the envelope material 40 containing, for example, silicone is performed. The glazing is performed by means of an Ar—O₂ plasma to reduce the adhesiveness at the outer surface. In tapeless sawing, the arrangement is diced without, for example, previously affixing on a supporting tape serving as an auxiliary support. This saves costs for the tape, and the thus produced components 100 may directly be processed as bulk material.

In the completed optoelectronic components the cover plate 1 is implemented by the part of the support plate 10 remaining in the component. The housing body 4 is implemented by the remaining hardened envelope material 40.

Figure 2F:
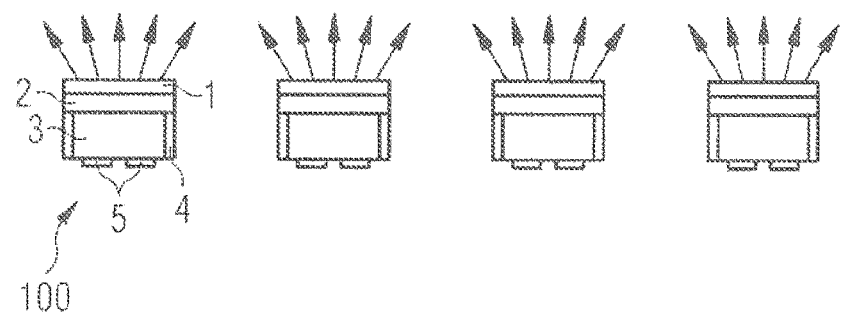
Figure 2G:
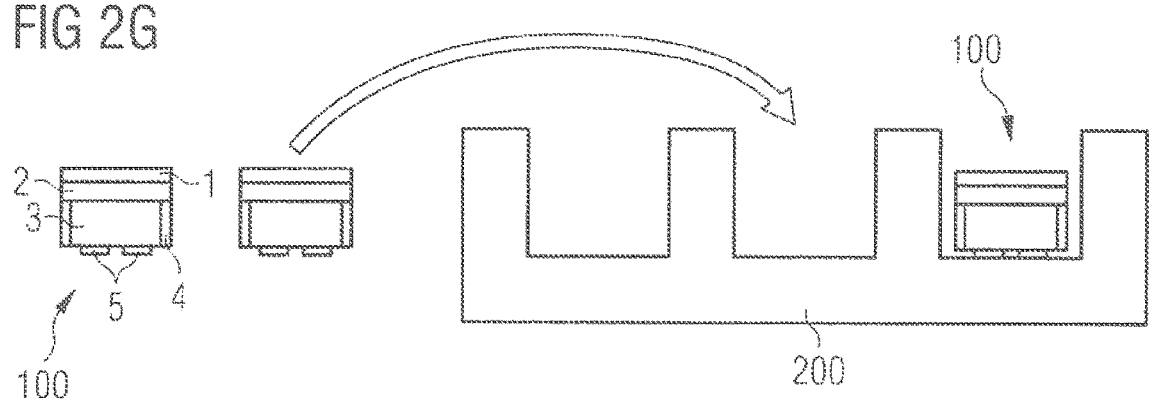

Subsequently, the components 100 are tested, FIG. 2F. Further, the components are installed at the place of destination, for example, in a housing 200.

In the method it is particularly remarkable that the envelope material 40 is introduced in the method step described in conjunction with FIG. 2D, the envelope material being free from any luminescence conversion material. As a consequence, lateral surfaces 3c of the optoelectronic semiconductor chips are covered by the envelope material 40 and not by the material of the conversion layer 2.

Figure 3A:
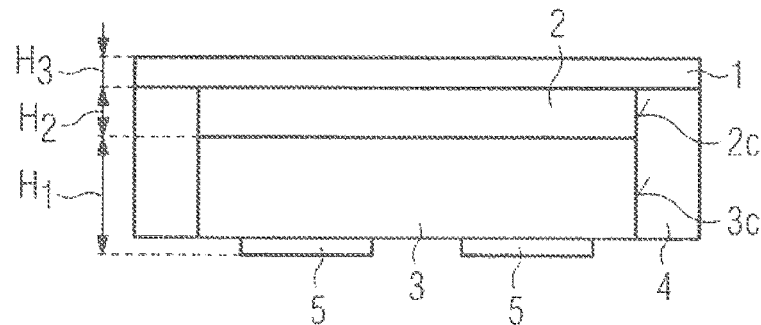
FIGS. 3A to 3C show schematic illustrations of an optoelectronic component according to a second embodiment.

In conjunction with the schematic sectional view of FIG. 3A, a second embodiment of an optoelectronic semiconductor component described herein is explained in more detail. Differing from the embodiment of FIG. 1A, conversion layer 2 does not protrude from the optoelectronic semiconductor chip 3 in lateral directions. Cover plate 1 protrudes from conversion layer 2 in lateral directions. For instance, the conversion layer 2 has a surface corresponding to the outer surface, facing it, of the semiconductor chip 3 in form and size within the manufacturing tolerance. Accordingly, housing body 4 may also extend along the lateral surfaces 2c of the conversion layer 2. As a consequence, housing body 4 is arranged at the lateral surfaces 3c of the optoelectronic semiconductor chip 3 as well as the lateral surfaces 2c of the conversion layer 2. This is particularly illustrated in the plan views of FIGS. 3B and 3C. In this regard, FIG. 3B shows the optoelectronic component illustrated in FIG. 3 from the side of the cover plate 1, whereas FIG. 3C shows a plan view of the bottom surface, remote from the cover plate 1, of the component.

Figure 1B:
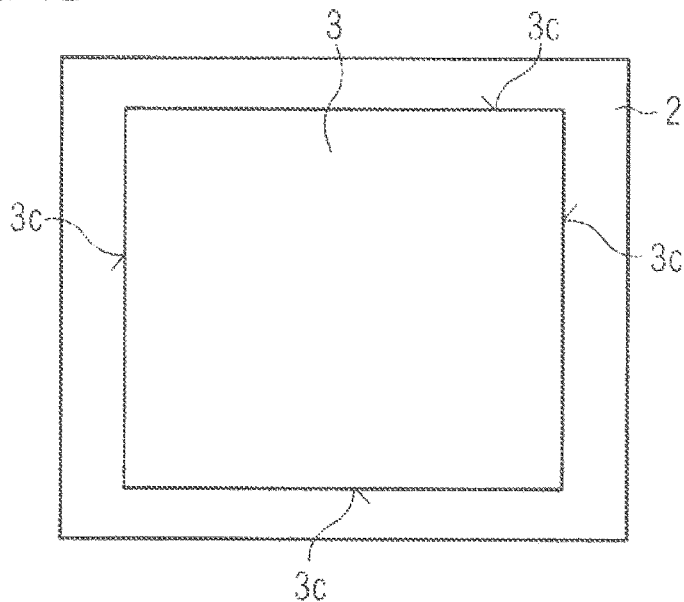
Figure 1C:
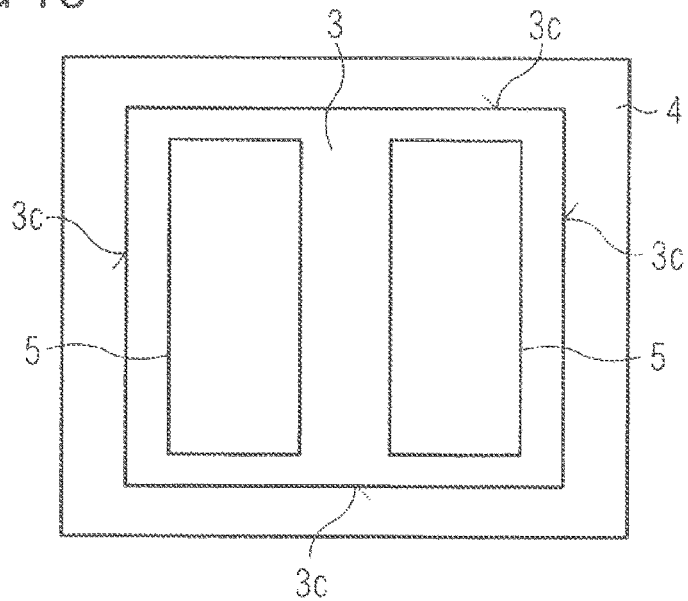
Figure 3B:
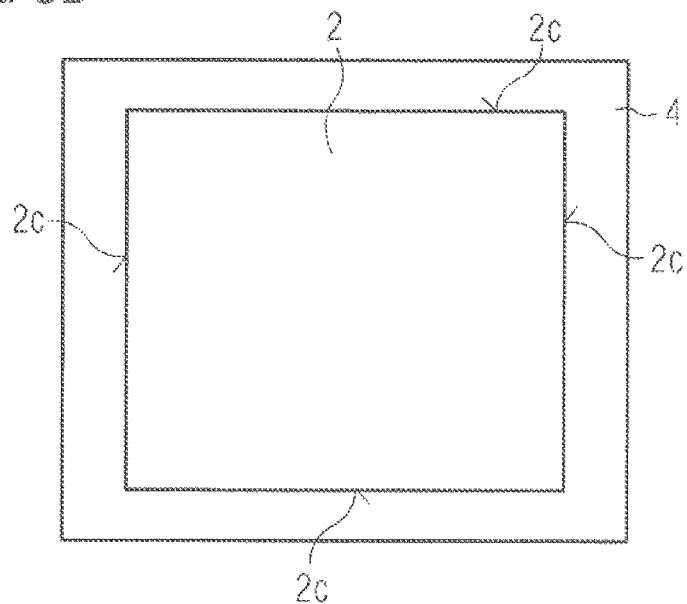
Figure 3C:
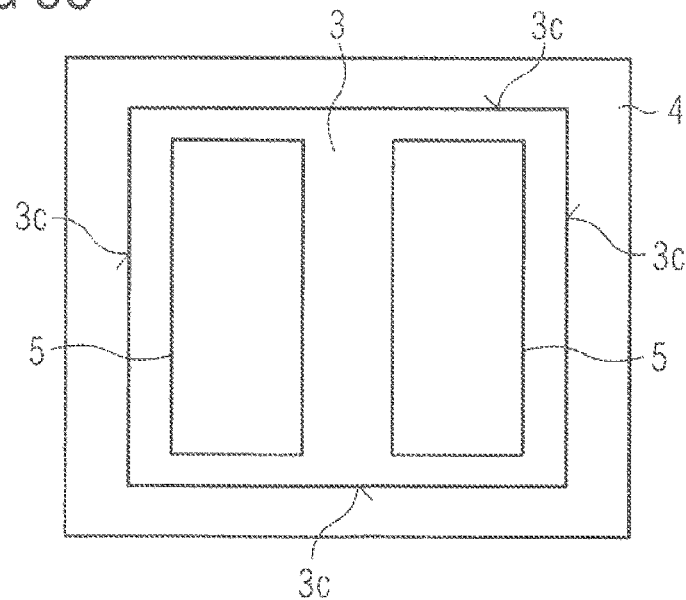

In comparison with the embodiment of FIGS. 1A to 1C, the embodiment of FIGS. 3A to 3C exhibit a further enhanced color homogeneity since long optical paths through the conversion layer are excluded in the portions in which the conversion layer laterally protrudes from the semiconductor chip 3.

In conjunction with FIGS. 4A to 4H, a method for manufacturing an optoelectronic component according to the second embodiment is described by means of schematic sectional views.

Figure 4A:
FIGS. 4A to 4H show schematic illustrations of a second embodiment of a method for manufacturing an optoelectronic component according to the second embodiment.

First, in the manufacturing method, the support plate 10, which may be, for example, a 6 inch glass plate, is provided, FIG. 4A.

Figure 4B:

Subsequently, the conversion layer 2 is applied in portions spaced apart from each other, for example, by means of spray coating. This is shown in FIG. 4B.

Figure 4C:
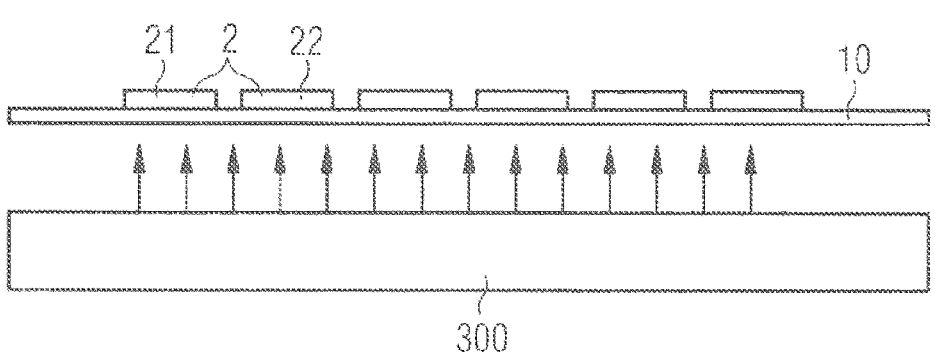

Then, the portions of the conversion layer 2 may simultaneously be tested with respect to the electromagnetic radiation generated by them upon irradiation, by means of a large-scale light source 300, FIG. 4C.

Figure 4D:
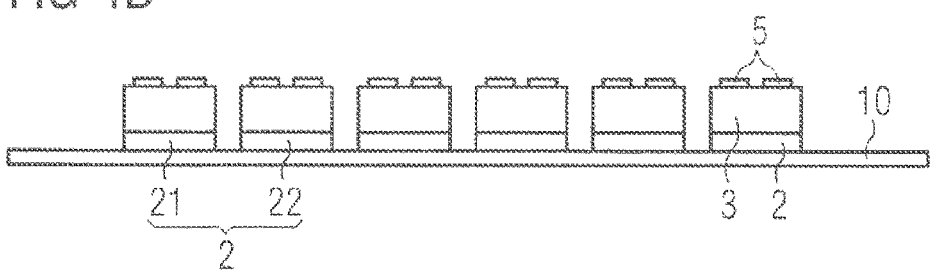

In the next method step, FIG. 4D, exactly one optoelectronic semiconductor chip 3 is respectively put on one portion of the conversion layer 2. In this way, the portions of the conversion layer and the optoelectronic semiconductor chips are associated to each other in a one-to-one relationship.

Figure 4E:
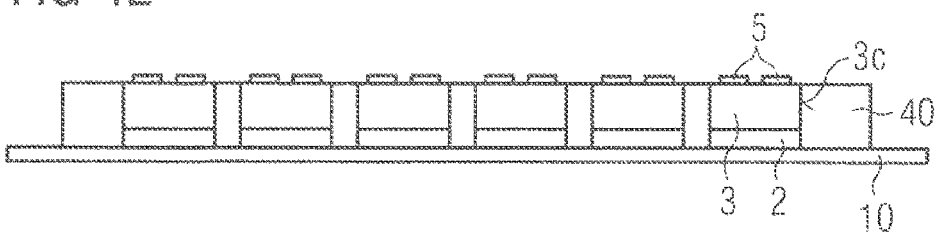

In the next method step, FIG. 4E, the envelope material 40 is introduced between the optoelectronic semiconductor chips 3, wherein the optoelectronic semiconductor chips 3 remain free from or uncovered by the envelope material 40 at their side remote from the support plate 10. After being introduced, the envelope material 40 is in direct contact with the lateral surfaces 3c of the optoelectronic semiconductor chips 3 and the lateral surfaces 2c of the conversion layer 2 in the individual portions and the support plate 10.

Figure 4F:
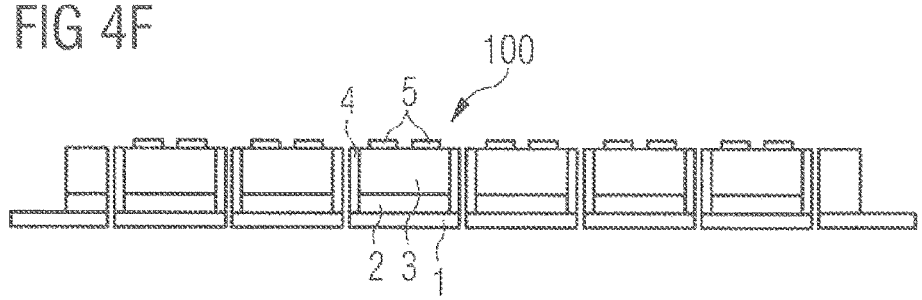
Figure 4G:
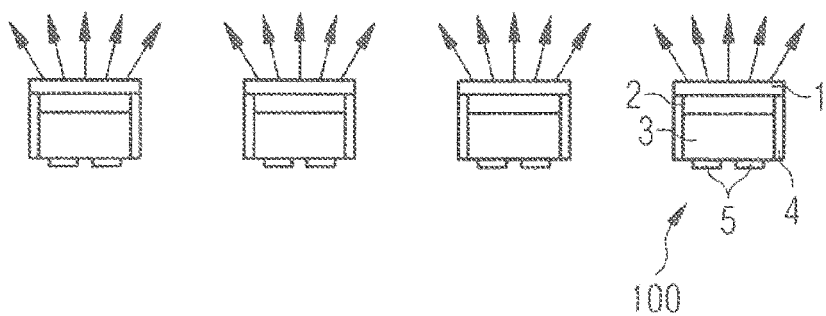
Figure 4H:
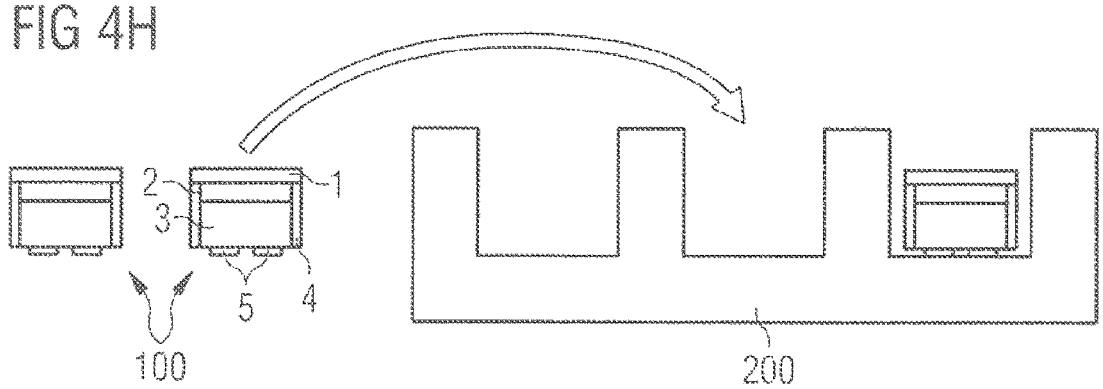

After hardening or curing the envelope material 40, in the method step shown in conjunction with FIG. 4F, dicing into individual optoelectronic components 100 is performed, which may subsequently be tested, FIG. 4G, and may finally be installed at the place of destination, for example, in a housing 200, in the method step described in conjunction with FIG. 4H.

Generally, the optoelectronic components described here are characterized in that they are mechanically particularly stable both during and after their manufacturing due to the support plate or rather the cover plate. This enables a particularly waste-free surface mounting of the optoelectronic components because a destruction of the optoelectronic components during the surface mounting is less likely to occur due to the increase of mechanical stability.

Furthermore, in the optoelectronic components described here the conversion layer may be applied to the optoelectronic semiconductor chips without pad or platelet transfer because the optoelectronic semiconductor chips may directly be put on the conversion layer during the manufacture thereof. This enables a particularly fast and cost-effective manufacturing of the optoelectronic components. Rapidly executable and cost-effective methods such as film-assisted molding may additionally be used enabling the simultaneous enveloping of a plurality of optoelectronic semiconductor chips.

Particularly in the second embodiment of the method in which the conversion layer 2 is applied in form of portions spaced apart from each other, the portions of the conversion layer may be inspected regarding the light generated by them before the application of semiconductor chips. As a result, defective portions may be identified already prior to the mounting of the optoelectronic semiconductor chips, whereby finally less waste is produced, in turn leading to a more cost-effective manufacturing method.

Figure 5A:
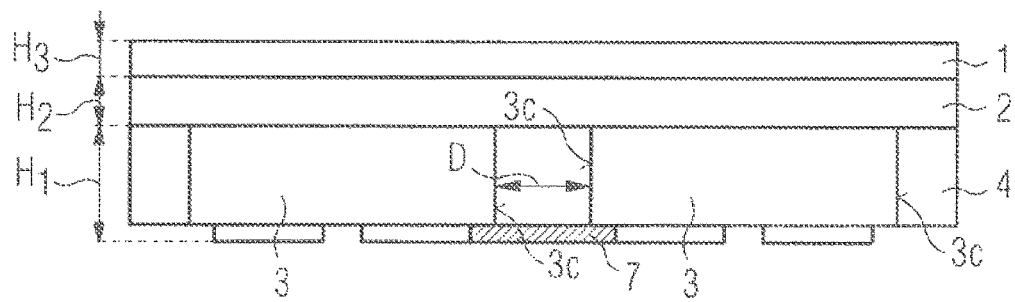
FIGS. 5A to 5C show schematic illustrations of an optoelectronic component according to a third embodiment.
Figure 5B:
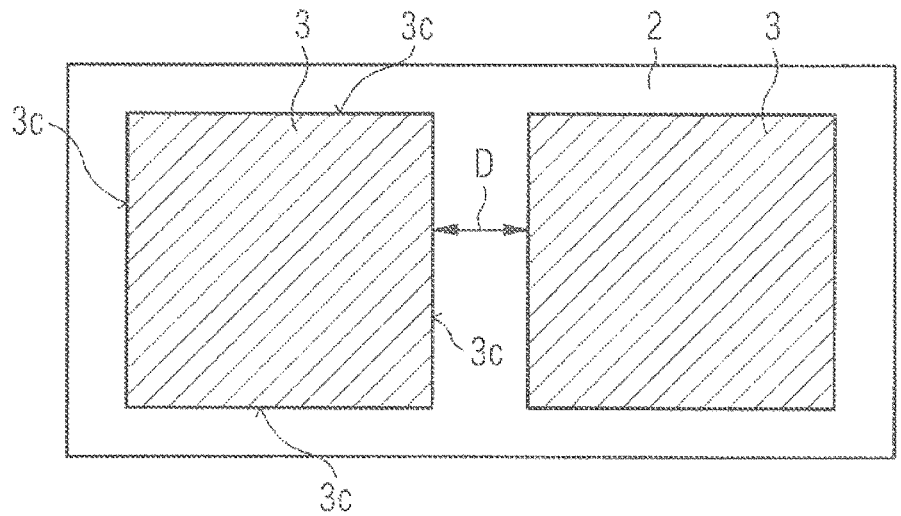
Figure 5C:
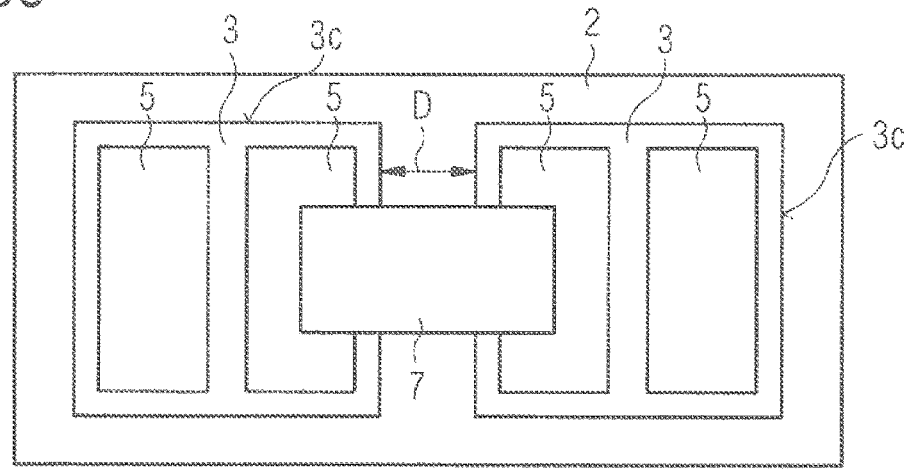

In conjunction with the schematic illustrations of FIGS. 5A, 5B and 5C, a third embodiment of a component described here is explained in more details. Differing from, for example, the embodiment described in conjunction with FIGS. 1A to 1C, in this embodiment the component 100 includes at least two or exactly two optoelectronic semiconductor chips 3. The optoelectronic semiconductor chips 3 are embedded in the housing body 4 such that material of the housing body 4 is also disposed between the two optoelectronic semiconductor chips 3. In the present embodiment, the optoelectronic semiconductor chips 3 are electrically connected with each other at their bottom surface remote from the cover plate 1 by means of the electric connecting element 7 and, for example, electrically connected in series. However, the electric connection element 7 may also be omitted if a wiring of the optoelectronic semiconductor chips 3 at the place of destination is performed, for example, by means of the contact points and conducting paths of a circuit board.

The distance D between the adjacent optoelectronic semiconductor chips 3 ranges, for example, between at least 20 μm and at most 5 μm. In this way, the distance needed to be bridged by the electric connecting element 7 is particularly small.

In the embodiment of FIGS. 5A to 5C, the optoelectronic semiconductor chips 3 are completely covered at their upper surface both by the cover body 1 as well as by the conversion layer 2. The conversion layer 2 is formed as a continuous layer not patterned into individual portions. This enables a particularly cost-effective manufacturing of the optoelectronic component.

In conjunction with FIGS. 6A to 6H, an embodiment of a method for manufacturing a component according to the third embodiment, described in conjunction with FIGS. 5A to 5C, is explained in more detail by means of schematic sectional views. The manufacturing method may be performed in an analogous manner as the manufacturing method described in conjunction with FIGS. 2A to 2G.

Figure 6A:
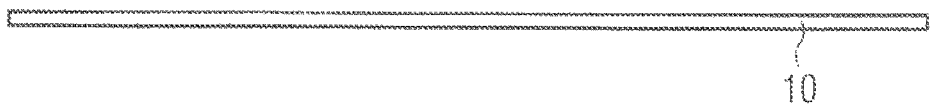
FIGS. 6A to 6H show schematic illustrations of a third embodiment of a method for manufacturing an optoelectronic component according to the third embodiment.

In more detail, first, a support plate 10 comprising a glass material and, for example, consisting of a glass is provided, FIG. 6A.

Figure 6B:
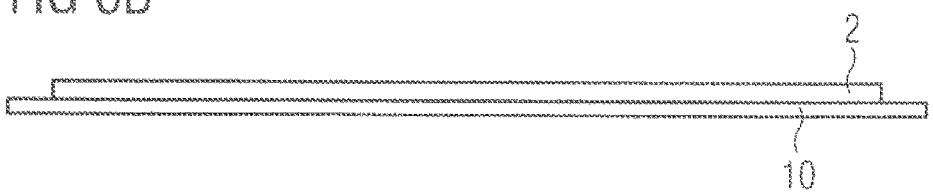

In the next method step, FIG. 6B, an unpatterned conversion layer 2 including a luminescence conversion material is applied to the upper surface of the support plate 10.

Figure 6C:
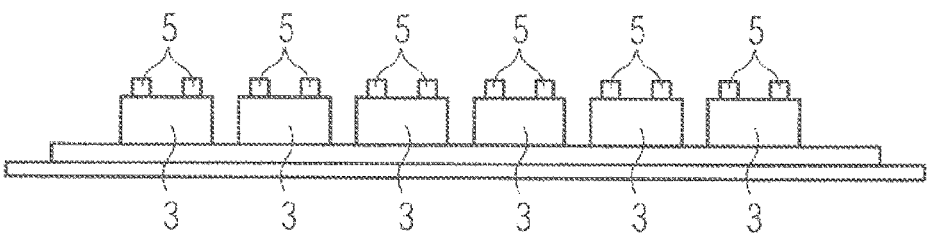

In the following method step, FIG. 6C, optoelectronic semiconductor chips 3 are applied to the conversion layer at its side opposite to the support plate 10, wherein contact pads for contacting the optoelectronic semiconductor chips are remote from the support plate. The optoelectronic semiconductor chips therefore are surface mountable optoelectronic semiconductor chips at which all contact pads are arranged at one side of the associated semiconductor chip 3. For example, the optoelectronic semiconductor chips 3 are so-called sapphire-flip-chips.

Figure 6D:
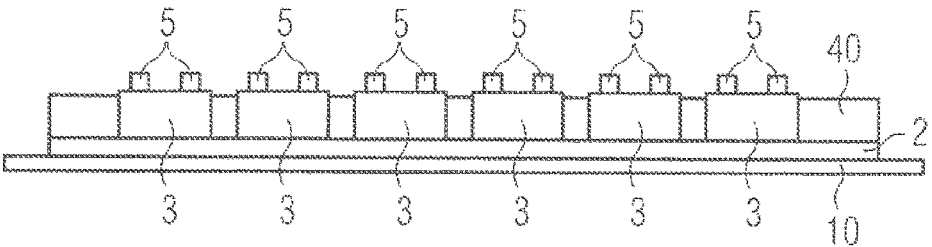

In the next method step described in more detail in conjunction with FIG. 6D, the envelope material 40 devoid of a luminescence conversion material is introduced between the optoelectronic semiconductor chips 3. For instance, the envelope material 40 flushes with the optoelectronic semiconductor chips 3 at their side opposite to the support plate 10.

Figure 6E:
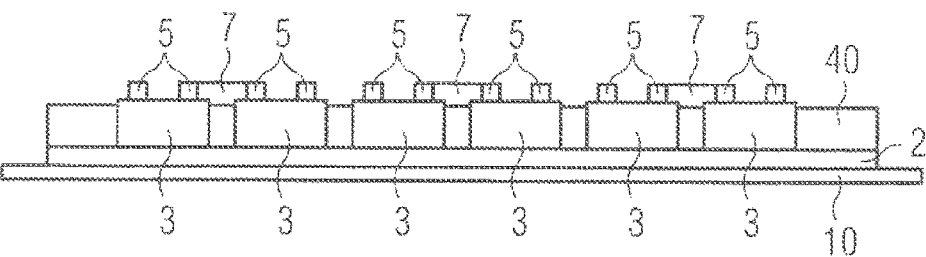

In the following method step, FIG. 6E, electric connecting elements 7 are introduced between two adjacent optoelectronic semiconductor chips, respectively, the electric connecting elements 7 being in direct electric contact with corresponding contact pads 5 of the optoelectronic semiconductor chips 3. The electric connecting elements 7 may, for example, be applied by means of a PVD procedure. The electric connecting elements in parts are in direct contact with the envelope material 40 and are fixed at the envelope material 40.

Figure 6F:
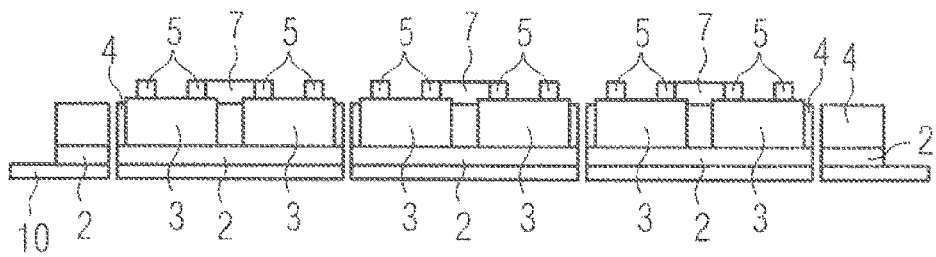
Figure 6G:
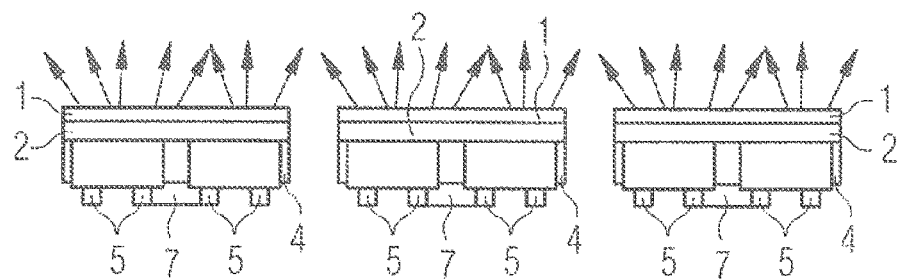
Figure 6H:
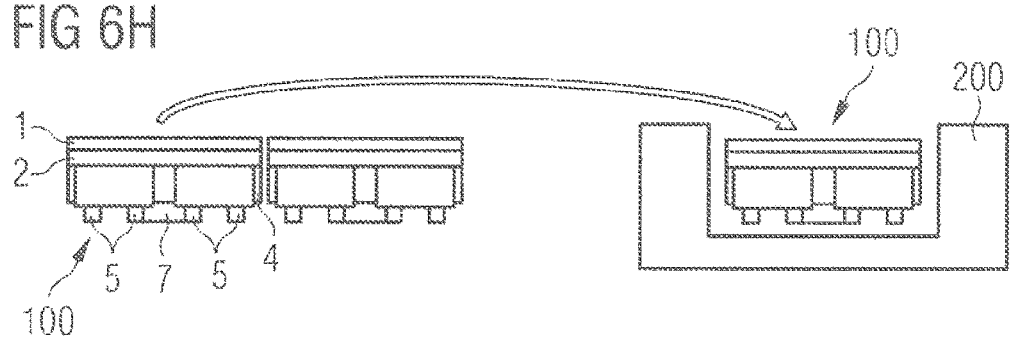

In the following method step, FIG. 6F, dicing into optoelectronic components is performed, wherein according to the present embodiment each component 100 includes exactly two optoelectronic semiconductor chips 3.

Then, the components are tested as described above, see FIG. 6G, and installed in the housing 200.

Figure 7A:
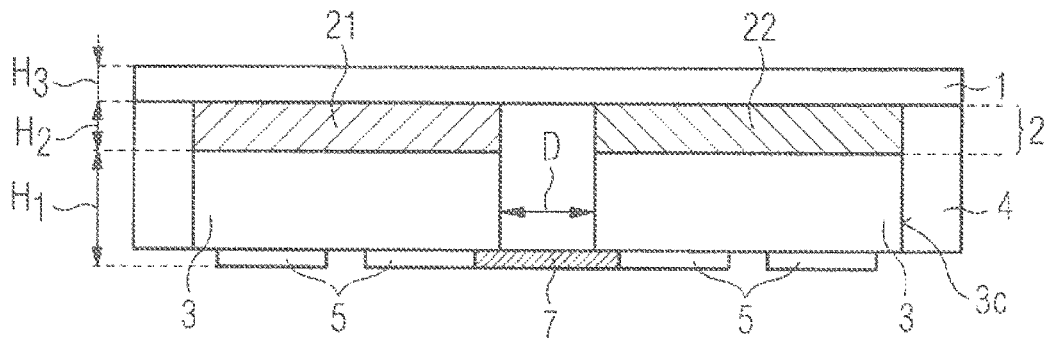
FIGS. 7A to 7C show schematic illustrations of an optoelectronic component according to a fourth embodiment.
Figure 7B:
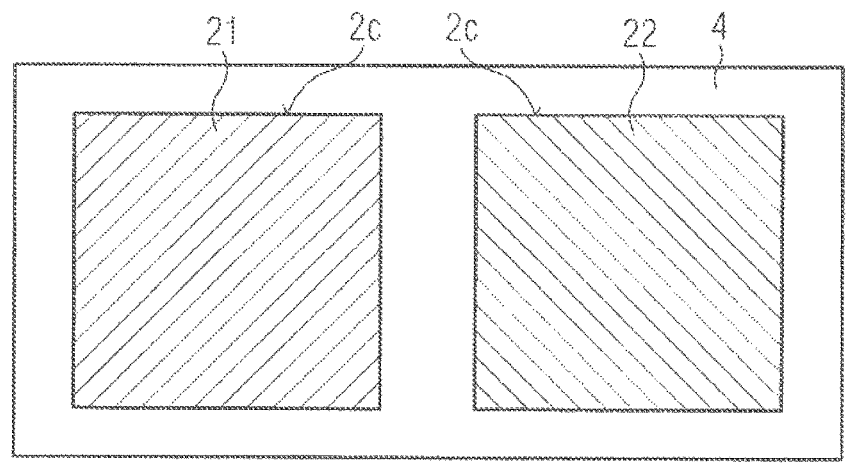
Figure 7C:
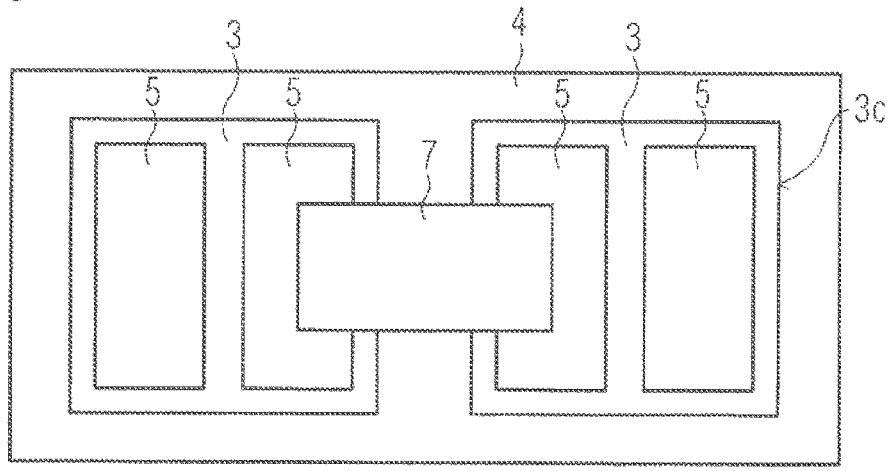

In conjunction with the schematic figures of FIG. 7A to 7C, a fourth embodiment of an optoelectronic component described herein is explained in further details. Differing from the embodiment described in conjunction with FIGS. 5A to 5C, in this embodiment the conversion layer is not formed as a continuous layer, but a portion 21, 22 of the conversion layer 2 is associated to each of the optoelectronic semiconductor chip in a one-to-one relationship. In doing so, the lateral surfaces 2c of the conversion layer are covered by the material of the housing body 4 also between the portions of the conversion layer 21, 22. In this manner, an optoelectronic component is implemented in which the optical path of electromagnetic radiation generated in the semiconductor chips 3 during operation of the component through the conversion layer 2 is not increased in the portion between the optoelectronic semiconductor chips leading to an enhanced color homogeneity of the generated mixed light.

In conjunction with the schematic illustrations of FIGS. 8A to 8I, an embodiment of a method for manufacturing a component according to the fourth embodiment is explained in more detail. Differing from the embodiment explained, for example, in conjunction with FIGS. 6A to 6H, in this embodiment a patterned conversion layer 2 comprising corresponding portions 21, 22 is applied, FIG. 8B, to the support plate 10 provided in the first method step, FIG. 8A.

Figure 8A:
FIGS. 8A to 8I show schematic illustrations of a fourth embodiment of a method for manufacturing an optoelectronic component according to the fourth embodiment.
Figure 8B:
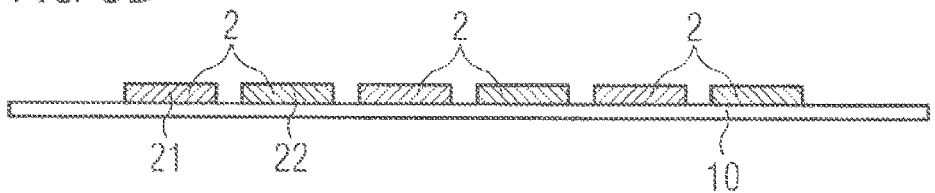
Figure 8C:
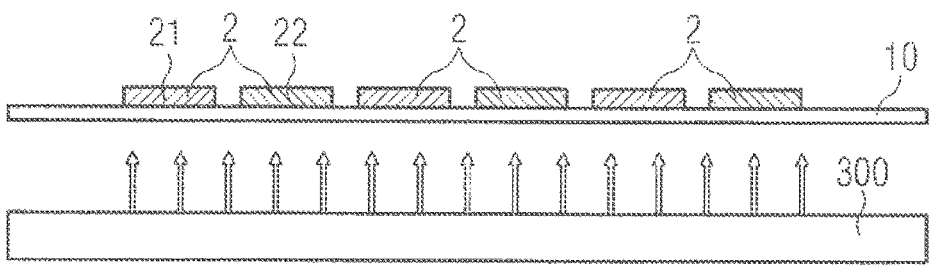

In the optional method step described in conjunction with FIG. 8C, the portions 21, 22 of the conversion layer 2 may optically be inspected by means of a light source 300.

Figure 8D:
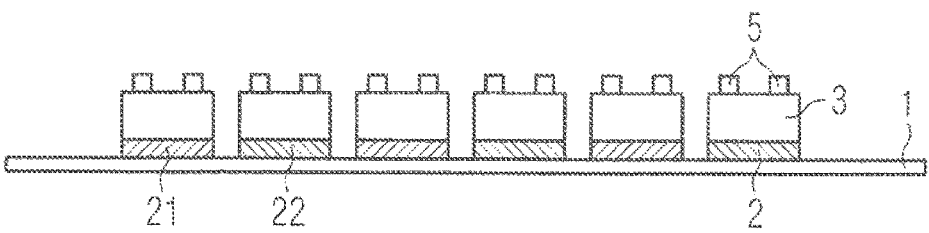

In the next method step, FIG. 8D, the optoelectronic semiconductor chips 3 are applied to the portions 21, 22 of the conversion layer 2, wherein one optoelectronic semiconductor chip 3 is associated to each portion 21, 22 in a one-to-one relationship, FIG. 8D.

Figure 8E:
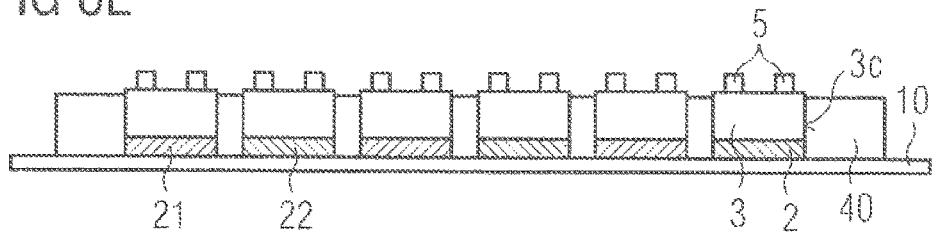

In the next method step, FIG. 8E, the envelope material 40 is applied so as to also extend between the portions 21, 22 of the conversion layer 2. As a result, lateral surfaces of the portions of the conversion layer 2 are also covered by the material of the envelope material 40.

Figure 8F:
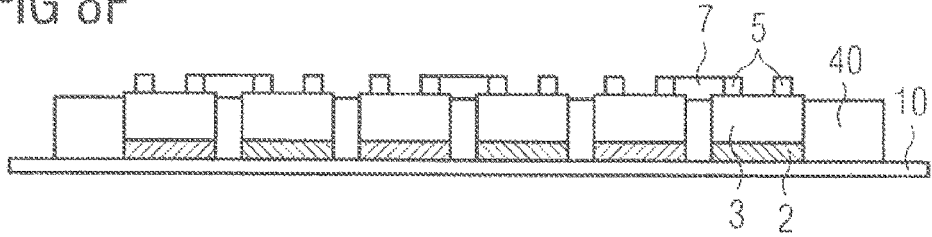

In the next method step, FIG. 8F, the electric connecting elements 7 which electrically connect contact pads 5 of the optoelectronic semiconductor chips with each other may be applied between adjacent optoelectronic semiconductor chips 3.

Figure 8G:
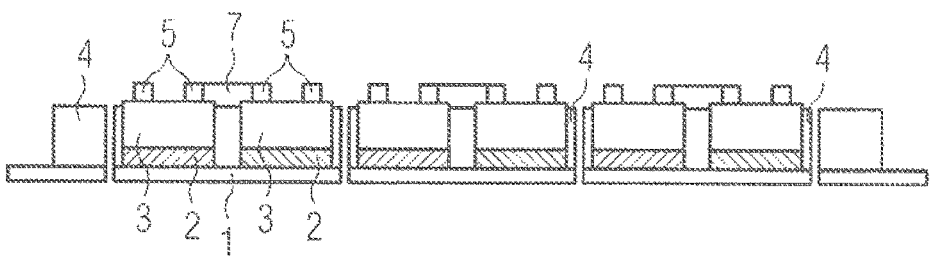
Figure 8H:
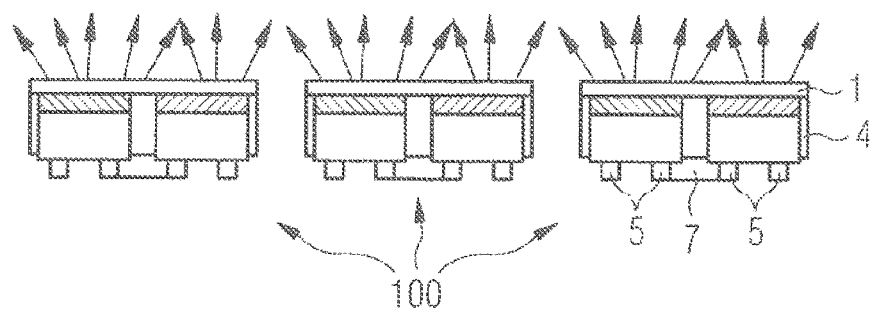
Figure 8I:
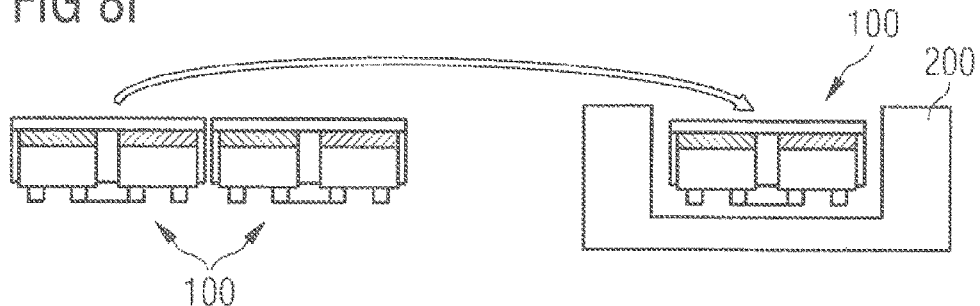

In conjunction with FIGS. 8G and 8H, dicing, testing and mounting of the produced optoelectronic components 100 are shown again.

Figure 9A:
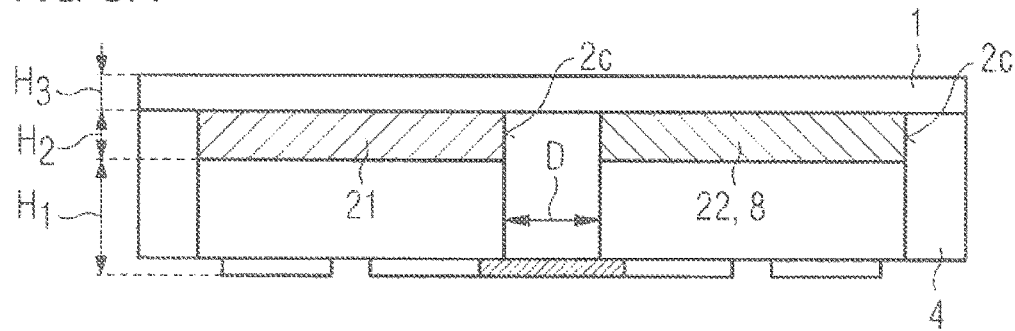
FIGS. 9A to 9C show schematic illustrations of an optoelectronic component according to a fifth embodiment.
Figure 9B:
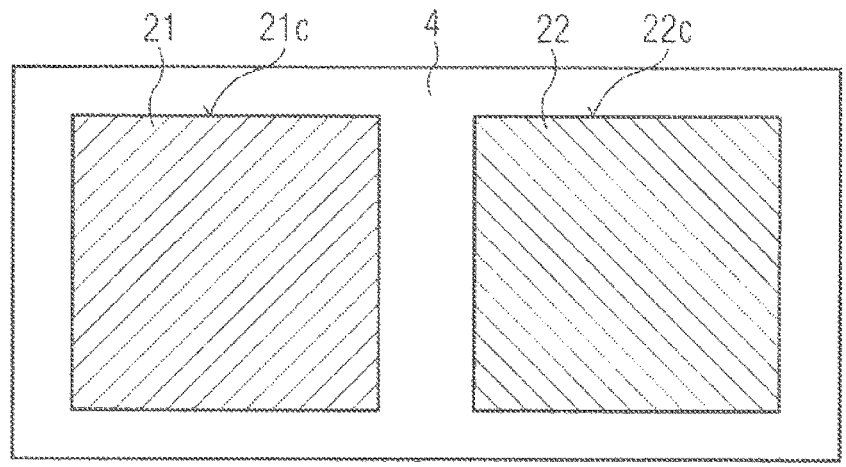
Figure 9C:
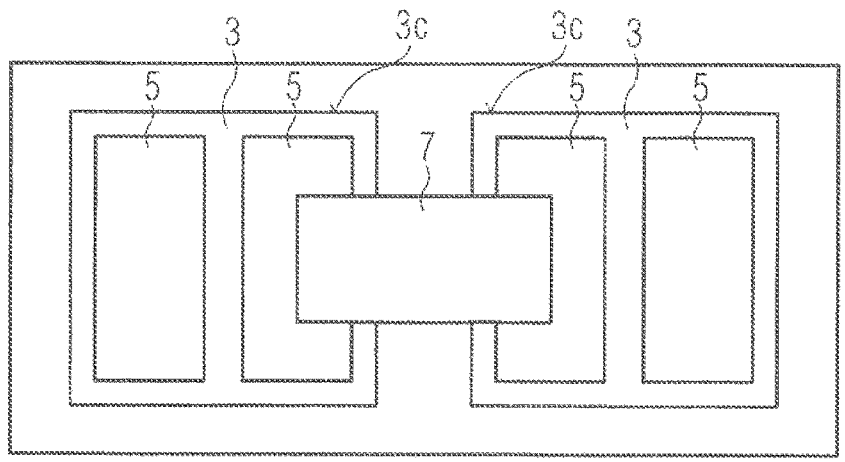
Figure 10A:
FIGS. 10A to 10G show schematic illustrations of a fifth embodiment of a method for manufacturing an optoelectronic component according to the fifth embodiment.
Figure 10B:
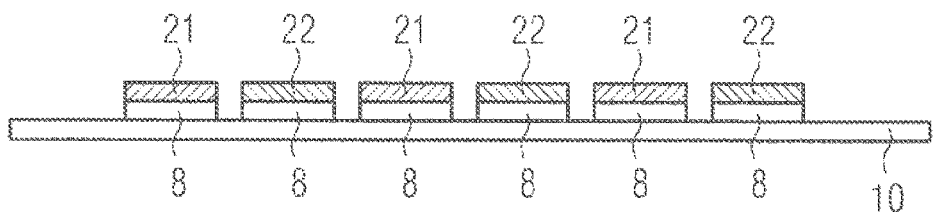
Figure 10C:
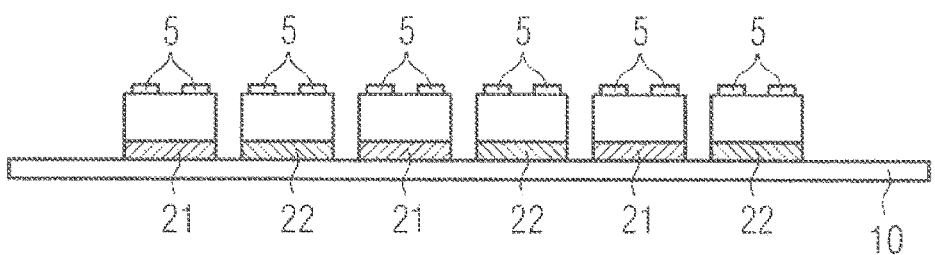
Figure 10D:
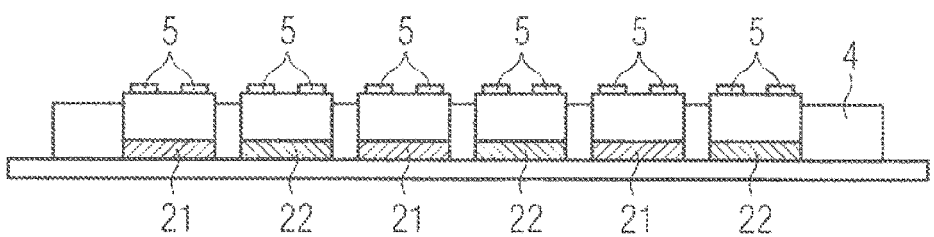
Figure 10E:
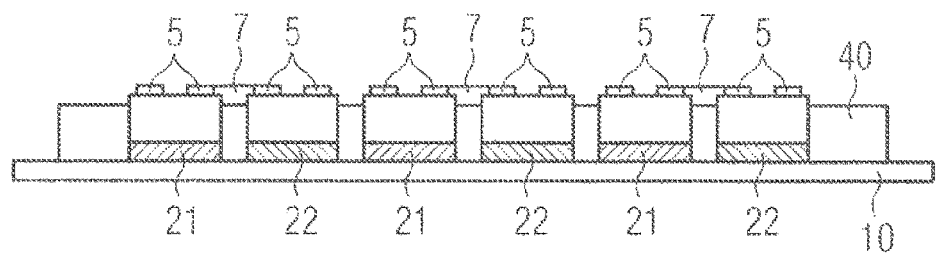
Figure 10F:
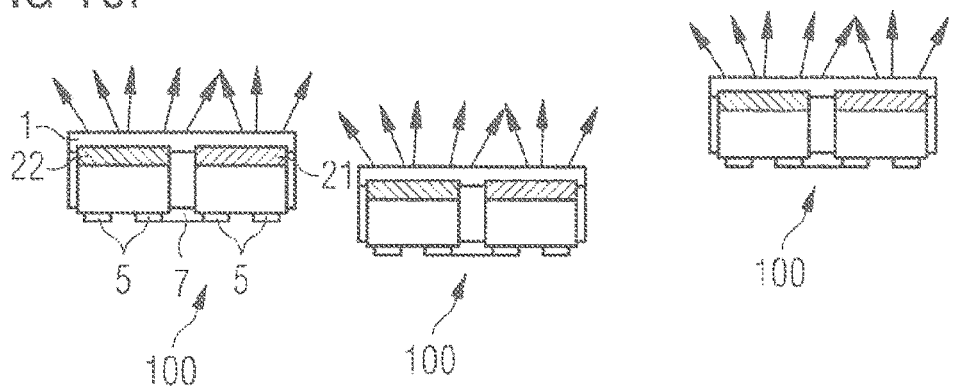
Figure 10G:
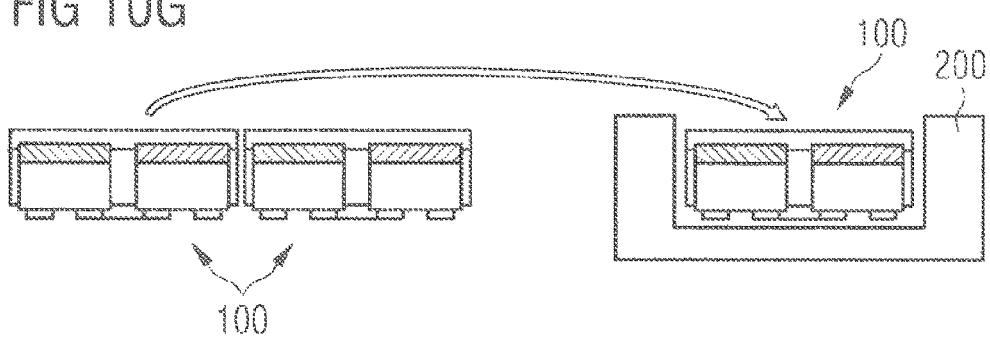

In conjunction with the schematic illustrations of FIG. 9A to 9C, a fifth embodiment of an optoelectronic component described herein is explained in more detail. In this embodiment, differing from the embodiment described in conjunction with FIGS. 7A to 7C, the different portions 21, 22 of the conversion layer 2 are formed to comprise different conversion materials. In this manner, the optoelectronic component may, for example, emit light of different color or different color coordinates from different portions. Thus, it is in particular possible that the component emits red, blue and green light or red, blue, green and white light. Furthermore, it is possible that the component emits white light of different color temperature.

In this regard, it may be particularly also possible that to at least one of the optoelectronic semiconductor chips of the component no portion of the conversion layer 2 is subordinated. As a result, non-converted blue light may be emitted from this portion of the component, for example. For height compensation between the optoelectronic semiconductor chip and the cover plate it is possible that a non-converting optical element, for example, a diffusing layer 8, configured to diffuse light generated by the optoelectronic semiconductor chip 3 in operation, is arranged between the optoelectronic semiconductor chip 3 and the cover plate 1.

Furthermore, it is possible that one of the optoelectronic semiconductor chips is formed by a sensor, for example, a photo detector. Thus, an ambient light sensor may be integrated into the component, for instance. In case that the component comprises a number of optoelectronic semiconductor chips 3 which emit light of color different to each other in operation due to the present portion 21, 22 of the conversion layer where appropriate, it is particularly possible that the housing body 4 is formed in a light absorbing manner, for example, black. In this way, the component may, for example, be used in a large screen display.

In conjunction with FIGS. 10A to 10G, an embodiment for manufacturing an optoelectronic component according to the fifth embodiment is explained in more detail. Differing from the embodiment described in conjunction with FIGS. 8A to 8I in this embodiment in conjunction with FIG. 10B it is indicated that alternatively to the structured conversion layer 2 a diffusing layer 8 or a not shown adhesive layer may be applied at least to some places of the support plate, to which, for example, in the later method step, FIG. 10C, optoelectronic semiconductor chips are applied the light of which emitted in operation is not to be converted or which are radiation detecting chips.

The further method steps shown for this embodiment correspond to the method steps described in conjunction with FIGS. 8A to 8I.

Figure 11A:
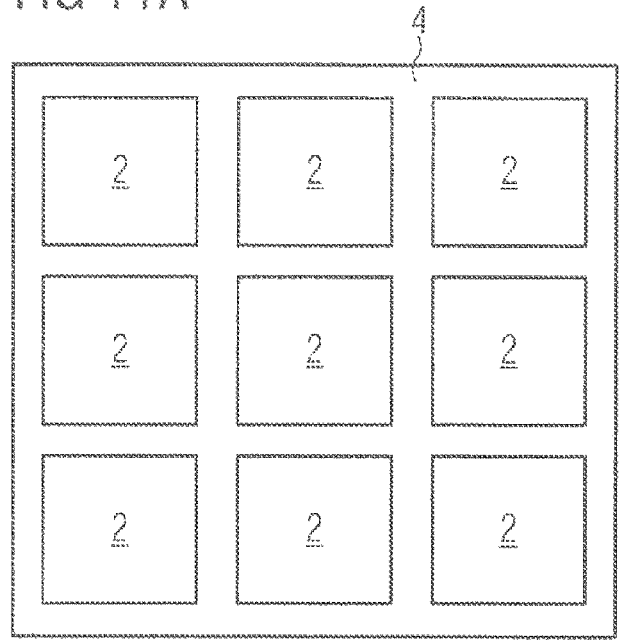
FIGS. 11A to 11B show schematic plan views of an optoelectronic component according to a sixth embodiment.
Figure 11B:
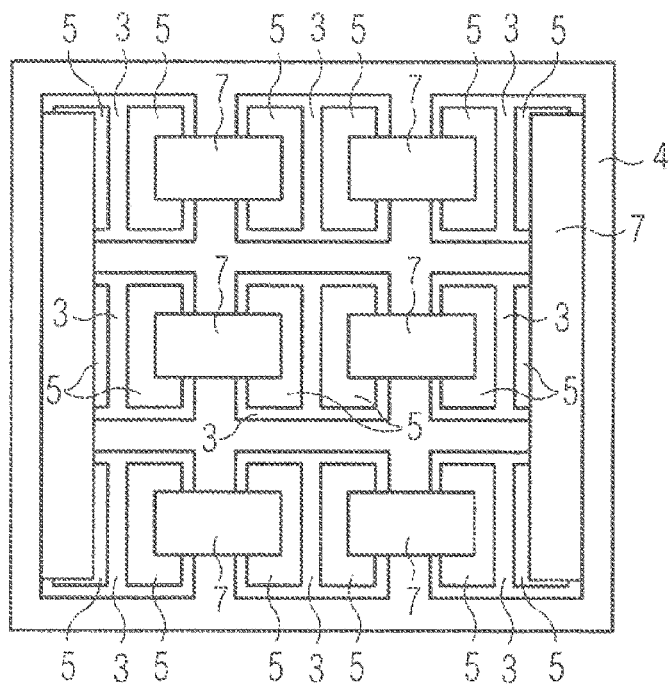

In conjunction with FIGS. 11A and 11B, a sixth embodiment of a component described here is explained in more detail by means of schematic plan views. In this embodiment, the component includes at least nine optoelectronic semiconductor chips 3, which may, for example, be similar light-emitting diode chips to which similar portions 21, 22 of a conversion layer 2 are respectively subordinated. Here, FIG. 11A shows a plan view of the emission surface of the component. FIG. 11B schematically shows the bottom surface of the component. As can be seen from FIG. 11B, the semiconductor chips 3 arranged in a common row of the component may be connected in series by means of the electric connecting elements 7. Connecting elements 7 are present at an edge portion, so as to connect the three series connections of optoelectronic semiconductor chips 3 in parallel to each other. Generally, by means of this embodiment it is explained that also complex wirings of the optoelectronic semiconductor chips 3 between each other are possible by means of the connecting elements 7.

The invention is not limited by the specification based on the embodiments. In fact, the invention includes each new feature as well as each combination of features particularly including each combination of features in the patent claims, even if this feature or this combination itself is not explicitly stated in the patent claims or embodiments.

The invention claimed is:

1. An optoelectronic component comprising
at least two optoelectronic semiconductor chips arranged laterally spaced apart from each other;
a conversion layer arranged at upper surfaces of the optoelectronic semiconductor chips; and
a cover plate including a glass,
wherein the conversion layer includes a luminescence conversion material,
wherein the conversion layer is arranged between the optoelectronic semiconductor chips and the cover plate,
wherein all the optoelectronic semiconductor chips of the optoelectronic component are covered by the cover plate, and
wherein lateral surfaces of the optoelectronic semiconductor chip are substantially free from the conversion layer; and
an electric connecting element at bottom surfaces of the optoelectronic semiconductor chips remote from the cover plate,
wherein the electric connecting element is arranged between two adjacent optoelectronic semiconductor chips, the electric connecting element being in direct electric contact with corresponding contact pads of the optoelectronic semiconductor chips, and
wherein at least two of the optoelectronic semiconductor chips being electrically connected by the electric connecting element.

2. The optoelectronic component according to claim 1, further comprising a housing body covering the lateral surfaces of the optoelectronic semiconductor chip, the housing body being reflective.

3. The optoelectronic component according to claim 2, wherein the housing body is arranged adjacent to lateral surfaces of the conversion layer.

4. The optoelectronic component according to claim 2, wherein the housing body is in direct contact with the optoelectronic semiconductor chips, the conversion layer and the cover plate.

5. The optoelectronic component according to claim 1, wherein the cover plate includes a glass into which particles of at least one of the following materials are introduced: a luminescence conversion material, another luminescence conversion material, a diffusor material.

6. The optoelectronic component according to claim 1,
wherein the conversion layer is partitioned into a number of portions,
wherein exactly one portion of the conversion layer is associated to each of the optoelectronic semiconductor chips in a one-to-one relationship,
wherein the portions are arranged laterally spaced apart from each other, and
wherein parts of a housing body are arranged between the portions.

7. The optoelectronic component according to claim 6, wherein portions associated to different optoelectronic semiconductor chips are different from each other regarding a thickness thereof and/or material composition thereof.

8. The optoelectronic component according to claim 1, wherein a distance between two adjacent optoelectronic semiconductor chips ranges between at least 20 µm and at most 50 µm.

9. The optoelectronic component according to claim 1, wherein a sidewall of the cover plate defines a sidewall of the optoelectronic component.

* * * * *